United States Patent [19]
Fathauer

[11] 3,987,400
[45] Oct. 19, 1976

[54] MULTIBAND SCANNING RADIO RECEIVER

[75] Inventor: George H. Fathauer, Mesa, Ariz.

[73] Assignee: Masco Corporation of Indiana, Taylor, Mich.

[22] Filed: Nov. 4, 1974

[21] Appl. No.: 520,438

[52] U.S. Cl. .............................. 325/470; 325/459; 334/15
[51] Int. Cl.² .......................................... H04B 1/32
[58] Field of Search .......................... 325/458–460, 325/462–465, 468–470, 490, 418–423; 334/14–16; 328/140

[56] References Cited
UNITED STATES PATENTS

| | | | |
|---|---|---|---|
| 2,902,598 | 9/1959 | Hills | 325/458 |
| 3,249,876 | 5/1966 | Harrison | 325/453 |
| 3,473,128 | 10/1969 | Kiser | 325/422 |
| 3,496,473 | 2/1970 | Seppeler et al. | 325/346 |
| 3,665,318 | 5/1972 | Hoffman et al. | 325/470 |
| 3,824,475 | 7/1974 | Pflasterer | 325/470 |
| 3,845,393 | 10/1974 | Basset | 325/453 |
| 3,873,924 | 3/1975 | Fathauer | 325/470 |

Primary Examiner—Robert L. Griffin
Assistant Examiner—Marc E. Bookbinder
Attorney, Agent, or Firm—Neuman, Williams, Anderson & Olson

[57] ABSTRACT

There is disclosed a signal-seeking, scanning superheterodyne radio receiver operable on all four bands comprising the public service radio frequencies. The receiver uses a single oscillator and appropriately controlled frequency multipliers to generate the required local oscillator signals. Circuitry is included for tracking the radio frequency portions of the receiver to tune them for optimum operation as the receiver is tuned to different portions of the individual bands. The tracking circuitry is responsive to the oscillator circuit and includes two parallel resonant circuits connected in series to generate a d.c. signal varying in amplitude in response to the oscillator frequency. Circuitry is also included for altering the magnitude of the d.c. signal in accord with the band to which the receiver is tuned.

14 Claims, 3 Drawing Figures

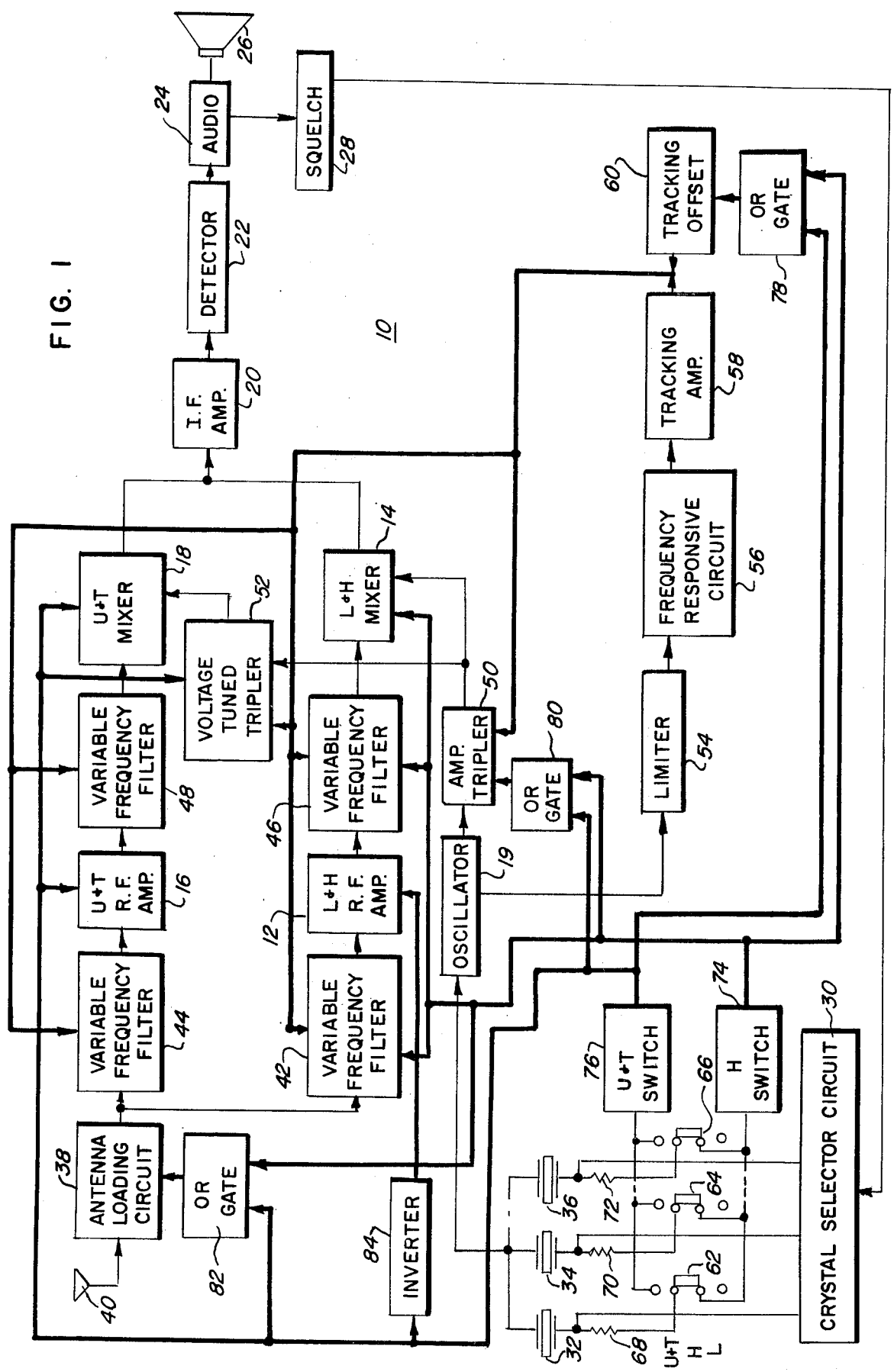

MULTIBAND SCANNING RADIO RECEIVER

BACKGROUND OF THE INVENTION

This invention relates to signal-seeking, scanning radio receivers and, more particularly, relates to such receivers which are capable of receiving signals in a plurality of frequency bands and to such receivers including circuitry for tracking the operation thereof over the width of a frequency band.

Signal-seeking, scanning radio receivers are, of course, well known in the art; they have found a particularly useful application in receivers designed to receive signals at frequencies designated by the U.S. Federal Communications Commission for use in the public safety radio sevices. Examples of such receivers appear in U.S. Pat. Nos. 3,531,724 to G. H. Fathauer, 3,665,318 to S. J. Hoffman, et al., 3,714,585 to R. C. Koch, 3,821,651 to G. H. Fathauer, 3,794,925 to K. Imazeki, and in the copending application Ser. No. 303,016 filed Nov. 2, 1972 by G. H. Fathauer now U.S. Pat. No. 3,873,924. The frequencies now designated for use by the public safety radio services are commonly referred to as falling within four bands, the low or "L" band including frequencies within the range of approximately 30–50 MHz, the high or "H" band including frequencies within the range of approximately 150–174 MHz, the ultra-high frequency or "U" band including frequencies within the range of approximately 450–470 MHz, and the ultra-high frequency or "T" band including frequencies within the range of approximately 470–512 MHz. The scanning radio receivers of the prior art have generally not been operable on all four of those frequency bands. Moreover, of those scanning radio receivers of the prior art which were operable on three of those bands, many could only be operated on two of the four bands at the same time, i.e., such receivers generally required separate radio frequency sections for each of the separate bands but were only operable with two such radio frequency sections so that, in order to use the receiver on a third band, it was necessary to physically remove from the receiver the radio frequency section corresponding to one of the bands and replace it with a radio frequency section corresponding to the new band. Receivers which were simultaneously operable on more than two bands generally required an undesirably large number of components and were, correspondingly, undesirably expensive and, moreover, were physically undesirably large. Such receivers could, of course, be reduced in physical size but only at the expense of other design considerations. Moreover, such receivers by including separate radio frequency sections often had an undesirably large number of duplicate components in the separate radio frequency sections.

Further, many signal-seeking, scanning radio receivers of the prior art have had the disadvantage associated therewith that a compromise was required between the sensitivity of the receiver and the ability of the receiver to receive signals across entire ones of the frequency bands. Thus, the receiver radio frequency sections could be either relatively broadly tuned so that the receiver would receive signals across an entire band but at a relatively low sensitivity level or the radio frequency sections could be more narrowly tuned to increase the receiver sensitivity over a portion of the desired band but a corresponding decrease in the sensitivity over the remaining portions of the band would occur. Circuitry for tracking the tuning of a radio frequency section of a scanning radio receiver is shown in the above-identified copending application, but separate tracking circuitry is there shown for each band in which this feature is desired. It is desirable to use the same tracking circuitry for all bands of operation of the receiver. Further, it is desirable to improve the performance of the tracking circuitry shown in that application.

SUMMARY OF THE INVENTION

There is provided by this invention a scanning radio receiver useful on a plurality of bands and using a minimal number of components. There is also provided by this invention a scanning radio receiver including tracking circuitry operable on a plurality of bands and of increased performance over the tracking circuits of the prior art.

It is an object of this invention to provide scanning radio receivers which are operable on all four public safety radio service frequency bands.

It is an object of this invention to provide scanning radio receivers operable on a plurality of bands and having a minimal number of component parts.

It is an object of this invention to provide scanning radio receivers operable on a plurality of bands which have a minimal number of duplicated components.

It is an object of this invention to provide scanning radio receivers having tracking circuitry operable on a plurality of bands.

It is an object of this invention to provide scanning radio receivers having tracking circuitry with performance superior to that provided by previously known circuits.

It is an object of this invention to provide scanning radio receivers fulfilling the above-mentioned objects and being further characterized by simplicity of design, economy of construction, and ease of operation.

Further and additional objects of this invention will be apparent from this specification and claims and the appended drawings and will be obvious to those skilled in the art.

DESCRIPTION OF THE DRAWING

FIG. 1 is a block diagram of one radio receiver of this invention; and

DESCRIPTION OF THE PREFERRED EMBODIMENT

Figure 2A:
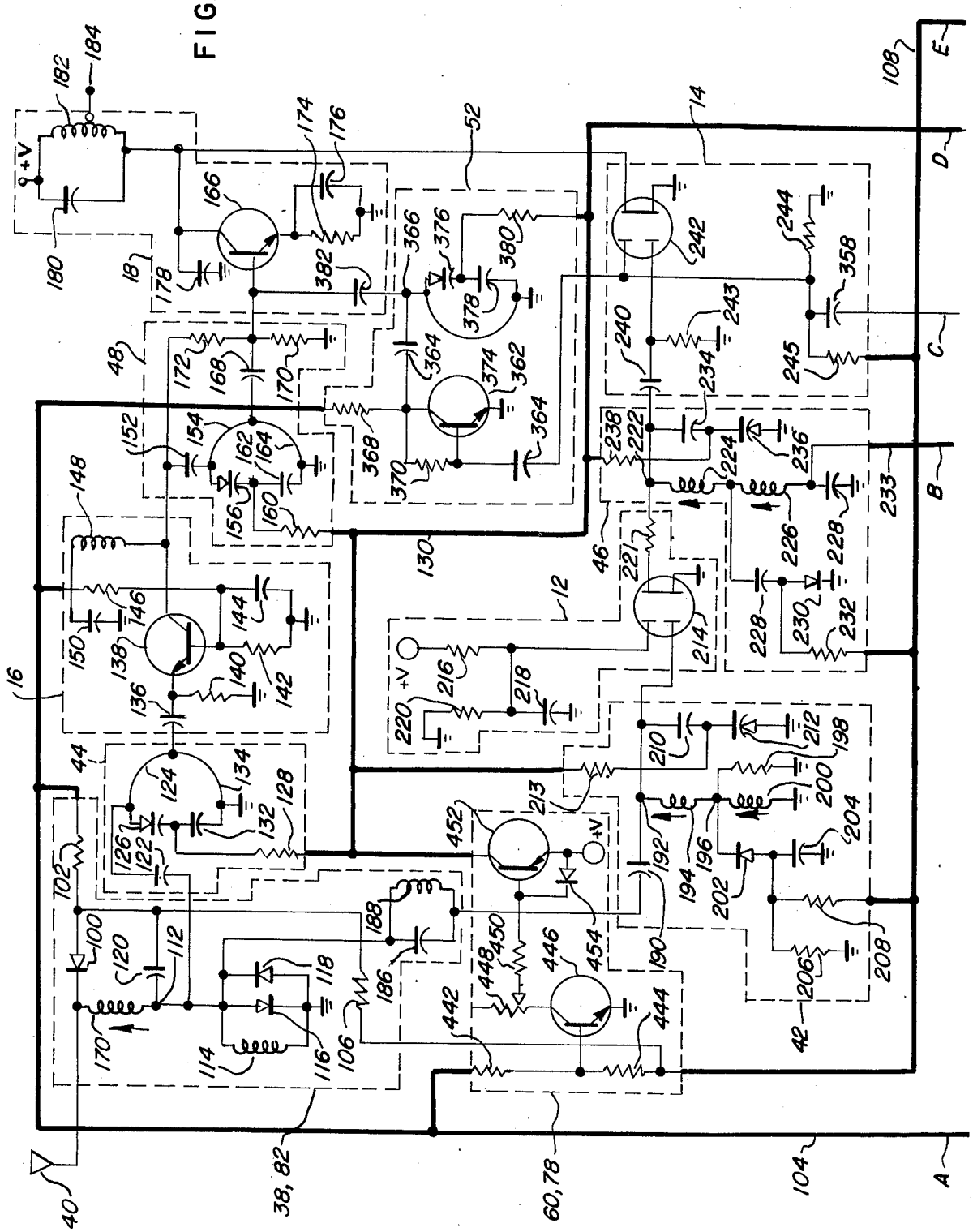
FIGS. 2a and 2b constitute a detailed schematic diagram of a portion of the radio receiver of FIG. 1.

There is disclosed in the drawing a radio receiver 10 including one embodiment of this invention which is capable of being sequentially tuned to a plurality of different radio frequencies or channels located in a plurality of bands. While only a single embodiment is disclosed, it will be apparent that this invention is of much broader application and may take many forms other than the receiver there shown.

The receiver 10 is capable of receiving radio signals at all frequencies designated by the United States Federal Communications Commission as comprising the public safety radio service frequencies, i.e., signals within the L, H, U, and T bands previously discussed. As shown in FIG. 1, the receiver includes two radio frequency sections, one operative on the L and H bands and comprising a radio frequency amplifier 12 and a mixer 14 and the other operative on the U and T bands and comprising a radio frequency amplifier 16 and a mixer 18. The radio frequency amplifiers 12 and 16 and the U and T band mixer 18 each include control inputs by which the normal operation of the respective circuits may be either enabled or disabled. The H and L band mixer 14 has a control input by which the gain thereof may be varied. An oscillator 19 capable of providing signals at a plurality of frequencies is provided and serves as a source of local oscillator signals for the mixers 14 and 18. The outputs of the mixers 14 and 18 are both coupled to an intermediate frequency amplifier 20 which, in turn, is coupled to a detector 22, an audio amplifier 24, and a speaker 26 in the conventional fashion. An output of audio amplifier 24 is also coupled to a noise actuated squelch circuit 28 which, in turn, is coupled to a crystal selector circuit 30. The intermediate frequency amplifier 20, detector 22, audio amplifier 24, and squelch circuit 28 may take on a variety of forms; the construction of circuits to suitably perform the functions thereof will be readily apparent to those of ordinary skill in the art and, thus, they need not be further discussed here.

Crystals 32, 34, and 36 are included in the receiver; each crystal determines the operating frequency of oscillator 19 when appropriately coupled thereto, and thus the frequency to which the receiver is tuned. Crystal selector circuit 30 in association with the output from squelch circuit 28 performs the function of sequentially and repetitively coupling one of crystals 32, 34, and 36 to oscillator 19 until the receiver is tuned to the frequency of a received signal. At the termination of the signal on the frequency to which the receiver is tuned, crystal selector circuit 30 again causes the crystals to be sequentially and repetitively coupled to oscillator 19 until the receiver is again tuned to a frequency at which a signal is received. While only three crystals, 32, 34, and 36, are shown in FIG. 1, any number of crystals might be used. Circuitry for performing the functions of crystal selector circuit 30 are well known to those skilled in the art. Examples of such circuits appear in the previously referenced United States patents and copending application now U.S. Pat. No. 3,873,924. The crystal selector circuit 30 of receiver 10 is operative to switch the output thereof corresponding to the selected crystal so that it is maintained at a reference potential with respect to the rest of the receiver whereas the other outputs are isolated from the remainder of the receiver. Crystal selector circuit 30 is also operative to correspondingly include the selected crystal within the circuit of oscillator 19.

Turning now more specifically to the particular circuitry provided by this invention, the receiver 10 includes an antenna loading circuit 38 having an antenna 40 coupled to the input thereof. The purpose of the loading circuit is to alter the tuning of antenna 40 in accord with both the signal present at a control input thereof and the frequency band to which the receiver is tuned. The output of the antenna loading circuit 38 is coupled through a variable frequency filter 42 to the L and H band radio frequency amplifier 12 and through a variable frequency filter 44 to the U and T band radio frequency amplifier 16. The outputs of the radio frequency amplifiers 12 and 16 are each coupled through a variable frequency filter 46 and 48, respectively, to the corresponding mixer. Each of variable frequency filters 42, 44, 46, and 48 is a voltage tuned filter which may have its center frequency varied in accord with the magnitude of the voltage present at a tracking input terminal thereof. The bands over which the center frequencies of variable frequency filters 42 and 46 may be varied may also be altered according to the presence or absence of a signal at control inputs thereof.

The output of oscillator 19 is coupled through an amplifier-tripler circuit 50 to both the L and H band mixer 14 and an input of a voltage tuned tripler 52. The amplifier-tripler circuit 50 is such that it may act as a simple amplifier or a frequency tripler depending on the signal present at a control input thereof. The frequency response of the tripler portion of amplifier-tripler circuit 50 may also be varied in accord with the magnitude of the voltage present at a tracking input terminal thereof. The frequency response of voltage tuned tripler 52 may likewise be varied in accord with the magnitude of the voltage present at a tracking input terminal thereof. The operation of tripler 52 is either enabled or disabled according to the signal present at a control input thereof and the output of the tripler 52 is applied to the U and T band mixer 18.

An output of oscillator 19 is applied through a limiter 54 to a frequency responsive circuit 56. Limiter 54 develops at its output a square wave signal of fixed amplitude at the frequency of the signal generated by oscillator 19. The frequency responsive circuit 56 responds to the output of limiter 54 and produces at its output a signal at the frequency of oscillator 19 but having an amplitude which varies in accord with the frequency response characteristics of circuit 56. A tracking amplifier 58 is provided which rectifies and amplifiers the output signal of the frequency responsive circuit 56 and, thus, produces at its output a d.c. voltage signal which varies in magnitude according to the frequency of operation of oscillator 19. That signal is applied to the tracking inputs of variable frequency filters 42, 44, 46, and 48, amplifier-tripler circuit 50, and voltage tuned tripler 52. A tracking offset circuit 60 is additionally provided for altering the d.c. level present at the output of tracking amplifier 58 in accord with a signal at a control input thereof and according to the particular band to which the receiver is tuned, as will be subsequently explained. For ease of understanding, the connections from the tracking amplifier to the various tracking inputs are shown in heavy lines in FIG. 1.

The circuitry for controlling the channel to which the receiver is tuned will now be further described. Each of the crystals 32, 34, and 36 has one terminal coupled to a common input of the oscillator 19 and a second terminal coupled individually to a respective output terminal of the crystal selector circuit 30. There is associated with each of the crystals 32, 34, and 36 a four contact, three-position switch 62, 64, and 66 as shown. The switches are manually positioned by the user to correspond to the frequency band in which any given channel falls. Thus, for example, if the channel corresponding to crystal 32 is in the L band, switch 62 is placed in the lowermost position shown so that the first and second contacts are electrically coupled together; if the channel is in the H band, switch 62 is placed in the middle position shown so that the second and third contacts are electrically coupled together; if the channel is in the U or T bands, switch 62 is placed in the uppermost position shown so that the third and fourth contacts are electrically coupled together. Resistors 68, 70, and 72 are individually coupled between the second terminals of the crystals 32, 34, and 36 and the third contacts of the corresponding switches 62, 64, and 66.

The second contacts of switches 62, 64, and 66 are coupled together and to an input of an H band switch circuit 74 while the fourth contacts thereof are coupled together and to an input of a U and T band switch circuit 76.

The outputs of crystal selector circuit 30 are applied through resistors 68, 70, and 72 to the third contacts of switches 62, 64, and 66, respectively. At any instant, if the receiver 10 is tuned to a channel in the H band, the output of crystal selector circuit 30 corresponding to that channel will be at the receiver reference level and that level will be applied through the corresponding switch 62, 64, or 66 to the input of H band switch circuit 74. Similarly, if at any instant the receiver is tuned to a channel in the U or T bands, the receiver reference voltage will be applied through the corresponding switch 62, 64, or 66 to the input of U and T band switch circuit 76. When the receiver is tuned to a channel in the band, no such voltage levels will be applied to the inputs of either of the band switch circuits 74 and 76.

The band switch circuits 74 and 76 are operative to supply at their output logic signals of logic levels zero or one to control the band in which receiver 10 operates. Each band switch circuit produces a logic level one signal at its output when its input is at the receiver reference level and a logic level zero signal when its input is not at that level. The connections of those logic signals to the various circuits of receiver 10 are shown in heavy lines for ease of understanding.

The outputs of H band switch 74 and U and T band switch 76 are coupled to first and second inputs, respectively, of an OR gate 78 having its output coupled to the control input of tracking offset circuit 60. The outputs of H band switch 74 and U and T band switch 76 are similarly coupled to first and second inputs, respectively, of an OR gate 80 having its output coupled to the control input of amplifier-tripler circuit 50 and to first and second inputs, respectively, of an OR gate 82 having its output coupled to the control input of antenna loading circuit 38. OR gates 78, 80, and 82 are each such that if a logic level one signal is present at either of the first or second inputs thereof, a logic level one signal is present at the output and applied to the control input of the associated tracking offset circuit 60, amplifier-tripler circuit 50, and antenna loading circuit 38, respectively, causing each of those circuits to operate in the manner appropriate to the receipt of signals in the H, U, or T bands. If no logic level one signals are applied to the inputs of OR gates 78, 80, and 82, a logic level zero signal is present at the gate output which causes the associated circuit to operate in the manner appropriate to receipt of signals in the L band. A logic level zero signal at the control input of antenna loading circuit 38 causes it to load antenna 40 to make it responsive to relatively low frequency signals while with a logic level one signal at that control input, that load is removed and antenna 40 is made responsive to relatively high frequency signals. A logic level zero signal at the input of amplifier-tripler circuit 50 causes that circuit to operate as a simple amplifier while a logic level one signal at that input causes the circuit to operate as a frequency tripler. The tracking offset circuit 60 is such that when a logic level zero signal is applied to its control input, the d.c. level at the output of tracking amplifier 58 is such that the tracking amplifier causes the center frequencies of filters 42 and 46 to appropriately track the tuned signal frequency over the L band while when a logic level one signal is applied to its control input, the d.c. level at the output of tracking amplifier 58 is such that the tracking circuit causes the center frequencies of filters 42 and 46 to appropriately track the tuned signal frequency over the H band, the center frequencies of filters 44 and 48 to appropriately track the tuned signal frequency over the U and T bands, and the frequency responses of amplifier-tripler circuit 50 and voltage tuned tripler 52 to appropriately track the frequency of operation of oscillator 19.

The output of H band switch 74 is also coupled to the control inputs of variable frequency filters 42 and 46 and L and H band mixer 14. The output of U and T band switch 76 is coupled to the control inputs of U and T band radio frequency amplifier 16, U and T band mixer 18, and voltage tuned tripler 52 and through an inverter 84 to the control input of the L and H band radio frequency amplifier. A logic level one signal at the control inputs of U and T band radio frequency amplifier 16, U and T band mixer 18, L and H band radio frequency amplifier 12, and voltage tuned tripler 52 causes the respective circuit to be enabled while a logic level zero signal at those control inputs causes the respective circuit to be disabled. A logic level one signal at the control inputs of variable frequency filters 42 and 46 causes those filters to be tuned to frequencies in the H band while a logic level zero signal causes them to be tuned to frequencies in the L band. A logic level one signal at the control input of L and H band mixer 14 causes the mixer to have a relatively high gain while a logic level zero signal causes the mixer to have a relatively low gain.

When the receiver is tuned to a channel in the L band, logic level zero signals are present at the output of both the H band switch 74 and the U and T band switch 76. Thus, logic level zero signals are applied to the control inputs of U and T band radio frequency amplifier 16, U and T band mixer 18, and voltage tuned tripler 52 disabling those three circuits, and a logic level one signal is applied by inverter 84 to the control input of L and H band radio frequency amplifier 14 enabling that circuit. Further, a logic level zero signal is applied to the control input of amplifier-tripler circuit 50 causing that circuit to act as a simple amplifier, logic level zero signals are applied to variable frequency filters 42 and 46 causing those filters to operate in the L band frequency range, and logic level zero signals are applied to L and H band mixer 14, antenna loading circuit 38, and tracking offset circuit 60 causing those circuits to operate in manners appropriate to receipt of signals on the L band.

When the receiver is tuned to a channel in the H band, a logic level one signal is present at the output of H band switch 74 and a logic level zero signal is present at the output of U and T band switch 76. In this situation, the U and T band radio frequency amplifier 16 and mixer 18 and voltage tuned tripler 52 are disabled and L and H band radio frequency amplifier 12 is enabled. Further, enabling signals are applied to the control input of amplifier-tripler circuit 50 causing that circuit to operate as a frequency tripler and to the control inputs of L and H band mixer 14, antenna loading circuit 38, variable frequency filters 42 and 46, and tracking offset circuit 60 causing those circuits to operate in manners appropriate to the receipt of signals on the H band.

When the receiver is tuned to a channel in the U or T bands, a logic level zero signal is present at the output of H band switch 74 and a logic level one signal is present at the output of U and T band switch 76. Thus, the U and T band radio frequency amplifier 16 and mixer 18 and voltage tuned tripler 52 are enabled while L and H band radio frequency amplifier 12 is disabled. A logic level one signal is applied to amplifier-tripler circuit 50 to cause that circuit to operate as a frequency tripler. Further, logic level one signals are also applied to antenna loading circuit 38 and tracking offset circuit 60 causing those circuits to operate in manners appropriate to receipt of signals on the U and T bands.

The manner in which receiver 10 may be tuned to channels in each of the L, H, U and T bands while using a single radio frequency oscillator 19 will be more fully explained. When the receiver is tuned to the L band, a signal at the frequency of operation of oscillator 19 is applied through amplifier-tripler circuit 50 to the L and H band mixer 14. That mixer operates in the conventional manner to form an intermediate frequency signal which is applied to the intermediate frequency amplifier 20. It has been found advantageous on the L band to operate oscillator 19 at frequencies above those of the received signals and use the difference frequency signal generated by mixer 14 as the intermediate frequency signal. Thus, if amplifier 20 has an intermediate frequency of 10.8 MHz, then the frequency of the output of oscillator 19 required to receive a channel in the L band is equal to the frequency of the channel plus 10.8 MHz. When the receiver is tuned to the H band, amplifier-tripler circuit 50 is operative to triple the frequency of the signal at the output of oscillator 19 before it is applied to mixer 14. On the H band, oscillator 19 is operated so that the output of amplifier-tripler circuit 50 is at frequencies below those of the received signals and the difference signal at the output of mixer 14 is used as the intermediate frequency signal. Thus, assuming an intermediate frequency of 10.8 MHz, the frequency of the output of oscillator 19 required to receive a channel in the H band is equal to one-third of the difference between the channel frequency and 10.8 MHz. When the receiver is tuned to U and T bands, the combination of amplifier-tripler 50 and voltage tuned tripler 52 are operative to multiply the frequency of the signal at the output of oscillator 19 by nine times before it is applied to U and T band mixer 18. The difference signal at the output of mixer 18 is also used as the intermediate frequency signal on the U and T bands and oscillator 19 is operated so that the output of voltage tuned tripler 52 is at frequencies below those of the received signals. Thus, still assuming a 10.8 MHz intermediate frequency, the frequency of the output of oscillator 19 required to receive a signal in the U or T bands is equal to one-ninth of the difference between the channel frequency and 10.8 MHz. It will be seen that by using local oscillator frequencies above those of the received signal in the L band and local oscillator frequencies below those of the received signals in the H, U, and T bands, the frequency range over which oscillator 19 must operate to tune the receiver over the H, U, and T bands lies completely within the frequency range over which that oscillator must operate in order to tune the receiver over the L band, i.e., in order to tune over the L band of 30–50 MHz, oscillator 19 must operate over the range of 40.8 to 60.8 MHz, in order to tune over the H band of 150–174 MHz, oscillator 19 must operate over the range of 46.4–54.4 MHz, and in order to tune over the U and T bands of 450–512 MHz, oscillator 19 must operate over the range of 48.8–55.7 MHz. Thus, the frequency range over which oscillator 19 must operate to receive signals over the full L, H, U, and T bands is minimized.

Radio frequency amplifiers operated over two relatively widely spaced frequency bands such as the L and H band radio frequency amplifier 12 often exhibit considerably different gains on the different bands. In receiver 10, the gain of amplifier 12 is considerably higher on the L band than on the H band. However, it is desirable to maintain a relatively constant amplitude signal at the input of intermediate frequency amplifier 20 despite changes in frequency band. In order to achieve this, the relative gain of the L and H band mixer 14 is made relatively low on the L band and relatively high on the H band.

The tracking circuitry included within receiver 10 insures that the frequencies of operation of variable frequency filters 42, 44, 46, and 48, amplifier-tripler 50, and voltage tuned tripler 52 correspond to that desired for reception of a signal at the frequency of the selected channel. Its operation will be more fully explained with reference to the circuitry of FIG. 2.

Figure 2B:
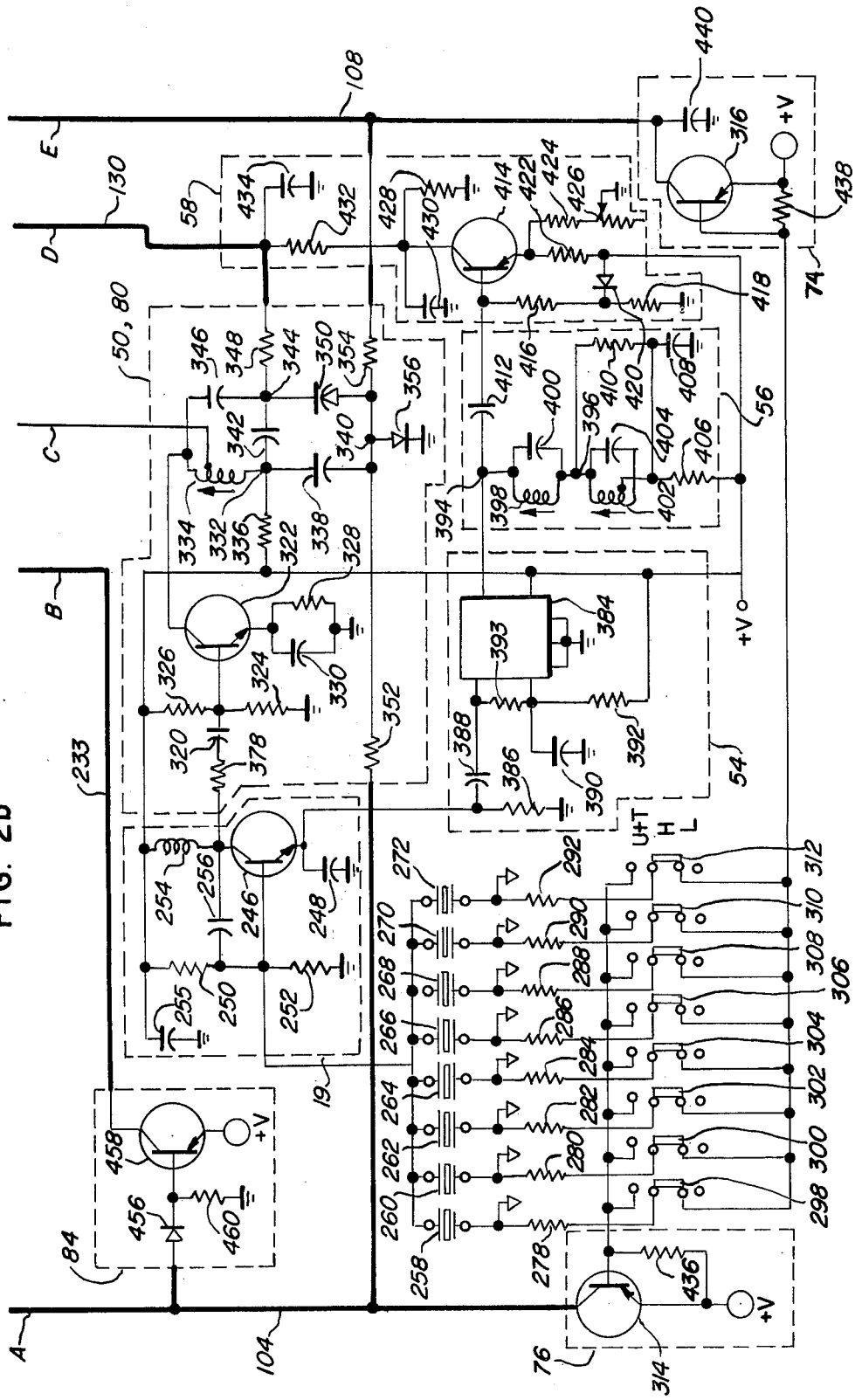

FIG. 2 is a schematic diagram of a portion of a radio receiver embodying this invention. It is shown in two parts, FIGS. 2a and 2b, the lines labelled A—E of Fig. 2a being coupled to the correspondingly labelled lines of FIG. 2b. For ease of explanation, various ones of the components of FIG. 2 have been placed within numbered boxes corresponding to the blocks included in FIG. 1. It should be understood that the correspondence between the blocks of FIG. 1 and the components within the boxes of FIG. 2 may not be exact. The connections in FIG. 2 corresponding to those shown in heavy lines in FIG. 1 are also shown in heavy lines in FIG. 2. Further, a positive voltage in the circuit of FIG. 2 corresponds to a logic level one in the description of FIG. 1 while a circuit ground potential corresponds to a logic level zero.

In the circuit of FIG. 2, antenna 40 is coupled to the cathode of a diode 100 having its anode coupled both through a resistor 102 to a U and T control line 104 and a resistor 106 to an H control line 108. Antenna 40 is also coupled through an inductor 110 to a circuit point 112. That circuit point is coupled through the parallel combination of an inductor 114 and two back-to-back diodes 116 and 118 to a circuit ground. Circuit point 112 is also coupled through a capacitor 120 to the anode of diode 100. Antenna 40 is normally useful for receiving high frequency signals in the H, U, and T bands. Diode 100 is utilized as a switching diode. When a positive potential is applied to the anode thereof from either of control lines 104 and 108, that diode becomes conductive so that capacitor 120 is effectively in parallel with inductor 110. The impedance of capacitor 112 is sufficiently low that the inductor 110 is shorted out and effectively removed from the circuit. When no positive potential is applied to the anode of diode 100, capacitor 120 is effectively excluded from the antenna loading circuit 38 placing inductor 110 in series with antenna 40 and lowering the resonant frequency of antenna 40 making it useful for receiving signals in the L band.

Circuit point 112 is coupled through a capacitor 122 to the junction of an inductor 124 and the anode of a voltage controlled capacitor 126. The cathode of that voltage controlled capacitor is coupled both through a resistor 128 to a tracking control line 130 and through a capacitor 132 to circuit ground. The inductor 124 is coupled both to ground an inductor 134 and through a capacitor 136 to the emitter of an NPN transistor 138. The emitter of that transistor is also coupled to ground through a resistor 140 while the base is coupled both to ground through the parallel combination of a resistor 142 and a capacitor 144 and to control line 104 through a resistor 146. The collector of transistor 138 is coupled to control line 104 through an inductor 148.

The voltage on tracking control line 130 is applied to the cathode of voltage variable capacitor 126 and is, thus, operative to vary the capacitance thereof and the center frequency of the variable frequency filter 44. The bias voltage for transistor 138 is supplied from control line 104. Thus, radio frequency amplifier 16 is operative only when a positive voltage is applied to control line 104. Inductor 148 serves to prevent the passage of radio frequency signals onto the control line 104. A capacitor 150 is also provided coupled between control line 104 and ground for removing any radio frequency signals which might otherwise be present on the control line.

The output of radio frequency amplifier 16 is taken from the collector of transistor 138 which is coupled through a capacitor 152 to the junction of an inductor 154 and the anode of a voltage controlled capacitor 156. The cathode of that voltage controlled capacitor is coupled both to the tracking control line 130 through a resistor 160 and to circuit ground through a capacitor 162. The inductor 154 is coupled both to ground through an inductor 164 and to the base of an NPN transistor 166 through a capacitor 168. The base of that transistor is additionally coupled to ground through a resistor 170 and to the collector of transistor 138 through a resistor 172. The emitter of transistor 166 is coupled to ground through the parallel combination of a resistor 174 and a capacitor 176 while the collector thereof is coupled to ground through a capacitor 178 and to a source of positive voltage V through the parallel combination of a capacitor 180 and an inductor 182. The output of mixer 18 is taken at a circuit point 184 coupled to a tap on inductor 182. That circuit point is coupled to the input of an intermediate frequency amplifier 20 as shown in FIG. 1.

The center frequency of variable frequency filter 48 is varied in accord with the voltage on tracking control line 130 just as is that of the variable frequency filter 42. The bias voltage for transistor 166 is supplied through the network of resistors 170 and 172 and inductor 148 and control line 104. Thus, the operation of mixer 18 is determined by the presence of a positive voltage on control line 104.

Circuit point 112 in the antenna loading circuit 38 is coupled through the parallel combination of a capacitor 186 and an inductor 188 to a capacitor 190 which is, in turn, connected to a circuit point 192. That circuit point is coupled through an inductor 194 to a circuit point 196 coupled to ground through the parallel combination of a resistor 198 and an inductor 200. Circuit point 196 is also connected to the cathode of a diode 202 having its anode coupled to ground through the parallel combination of a capacitor 204 and a resistor 206. The anode of diode 202 is also coupled to control line 108 through a resistor 208. Circuit point 192 is coupled through a capacitor 210 to the cathode of a voltage controlled capacitor 212 having its anode coupled to ground. The cathode of the voltage controlled capacitor 212 is coupled through a resistor 213 to control line 130.

Diode 202 in variable frequency filter 42 is used as a switching diode to shift the range of operation of that filter between the L and H bands. When a positive voltage is applied to the anode of that diode from control line 108, diode 202 is made conductive and capacitor 204 is effectively placed in parallel with inductor 200. The impedance of capacitor 204 is sufficiently low that inductor 200 is shorted out and effectively removed from the circuit causing the range of operation of variable frequency filter 42 to be in the H band. When no positive voltage is applied to the anode of diode 202, inductor 200 is effectively included in the operation of the filter circuit and the range of operation of variable frequency filter 42 is in the L band. The center frequency of the variable frequency filter 42 within the selected band is determined by the voltage applied from the tracking control line 130 to the cathode of voltage controlled capacitor 212.

The output of variable frequency filter 42 is taken from circuit point 192 and applied to a first gate of a dual gate, field effect transistor 214. The second gate of that transistor is coupled both through a resistor 216 to the positive voltage supply V and through the parallel combination of a capacitor 218 and a resistor 220 to ground. The source of transistor 214 is coupled to ground while the drain is coupled through a resisitor 221 to a circuit point 222. Circuit point 222 is coupled to ground through the series combination of two inductors 224 and 226 and a capacitor 228. The junction of inductors 224 and 226 is coupled through a capacitor 228 to the anode of a diode 230. The anode of that diode is also coupled through a resistor 232 to control line 108. The junction of inductor 226 and capacitor 228 is coupled to a control line 233. circuit point 222 is coupled through a capacitor 234 to the cathode of a voltage controlled capacitor 236 having its anode coupled to ground. The cathode of voltage controlled capacitor 236 is coupled through a resistor 238 to tracking control line 130.

Transistor 214 is used as the radio frequency amplifier and variable frequency filter 46 operates in a manner similar to that of filter 42, the frequency range of operation being dependent on the conductivity of diode 230 as determined by the voltage on control line 108. The radio frequency amplifier 12 is operative only when a positive voltage is supplied from control line 233 to the drain of transistor 214, resistor 221 and inductors 224 and 226. The output of variable frequency filter 46 is taken from circuit point 222 which is coupled through a capacitor 240 to the first gate of a dual gate field effect transistor 242 which is, in turn, coupled to ground through a resistor 243. The second gate of transistor 242 is coupled both to ground through a resistor 244 and to control line 233 through a resistor 245 while the source of transistor 242 is coupled to ground and the drain thereof is coupled to the collector of transistor 166 and, thus, through the parallel combination of capacitor 180 and inductor 184 to the positive voltage supply V. The output of mixer 14 is taken from the circuit point 184. A bias voltage operative to control the gain of transistor 242 is supplied from control line 108 through the voltage divider of resistors 244 and 245. Thus, mixer 14 has a relatively high gain when a positive voltage is applied to control line 108 and a relatively low gain in the absence of such a voltage.

The oscillator 19 includes an NPN transistor 246 which has its emitter coupled to ground through a capacitor 248, its base coupled to both positive voltage supply V through a resistor 250 and ground through a resistor 252, and its collector coupled to positive voltage supply V through an inductor 254. The positive voltage supply is at this point coupled to ground through a capacitor 255. The collector and base of transistor 246 are coupled together by a capacitor 256. The base of transistor 246 is also coupled to one terminal of each of eight crystals, 258, 260, 262, 264, 266, 268, 270, and 272. A second terminal of each of those crystals is each coupled through a resistor 278, 280, 282, 284, 286, 288, 290, and 292, respectively, to a third contact on a corresponding four contact three position switch 298, 300, 302, 304, 306, 308, 310, and 312, respectively, as shown. The fourth contacts of each of those switches are coupled together and to the base of a PNP transistor 314 while the second contacts thereof are coupled together and to the base of a PNP transistor 316. As in FIG. 1, the second terminals of each of the crystals is coupled to a corresponding output of crystal selector circuit 30. As mentioned, the crystal selector circuit 30 is such that the output thereof corresponding to the active channel is coupled to a reference voltage, here circuit ground, while the remaining outputs are isolated from ground by a relatively high impedance. Thus the crystal corresponding to the active channel at any time is coupled to ground and in the circuit of oscillator 19 and determines the frequency of operation of the oscillator.

One output of oscillator 19 is taken from the collector of transistor 246 and applied through the series combination of a resistor 318 and a capacitor 320 to the base of an NPN transistor 322 in amplifier-tripler circuit 50. The base of that transistor is also coupled to ground through a resistor 324 and to the positive voltage supply V through a resistor 326 while the emitter thereof is coupled to ground through the parallel combination of a resistor 328 and a capacitor 330. The collector of transistor 322 is coupled to a circuit point 332 through an inductor 334. That circuit point is coupled through a resistor 336 to the positive voltage supply V, through a capacitor 338 to a circuit point 340, and through a capacitor 342 to a circuit point 344. Circuit point 344 is coupled to the collector of transistor 322 through a capacitor 346, through a resistor 348 to the tracking control line 130, and to the cathode of a voltage controlled capacitor 350 having its anode connected to circuit point 340. That last-mentioned circuit point is additionally coupled to control lines 104 and 108 through resistors 352 and 354, respectively, and to the anode of a diode 356 having its cathode coupled to ground.

Diode 356 is used as a switching element to control whether amplifier-tripler circuit 50 is operated as an amplifier or a frequency tripler. The capacitances of capacitor 342 and voltage controlled capacitor 350 are much less than those of either of capacitor 338 and 346. When a forward biasing current is applied to diode 356 from either or both of control lines 104 or 108, circuit point 340 is placed at approximately the potential of circuit ground and resistor 336 is effectively removed from the circuit. The tuned circuit including primarily inductor 334, capacitor 342, and voltage controlled capacitor 350 is resonant at three times the frequency of oscillator 19. The voltage applied to voltage controlled capacitor 350 is effective to maintain the resonant frequency of that tuned circuit at three times the frequency of oscillator 19 with changes in the oscillator frequency. Thus, a signal at three times the frequency of oscillator 19 is developed at the output of the amplifier-tripler. When no positive voltage is applied to the anode of diode 356 from control lines 104 or 108, that diode is nonconductive. Resistor 336 is then effectively in series with the tuned circuit and the Q thereof is significantly lowered. Further, as will be more fully discussed subsequently, tracking offset ciruit 60 is operative to shift the voltage applied to voltage controlled capacitor 350 so that the tuned circuit is no longer resonant at the third harmonic of the oscillator 19 frequency. Resistor 336 is then the major portion of the load in the collector circuit of transistor 322. In that case, a signal at the frequency of oscillator 19 is developed at the output of the amplifier-tripler.

The output of amplifier-tripler circuit 50 is taken from a tap on inductor 334 and applied through a capacitor 358 to the second gate element of field effect transistor 242. The output of amplifier-tripler circuit 50 is additionally applied to the base of an NPN transistor 362 in tripler 52 by a capacitor 364 coupled thereto from the second gate of transistor 242. The emitter of transistor 362 is coupled to ground and the collector is coupled through a capacitor 364 to a circuit point 366, through a resistor 368 to control line 104, and through a resistor 370 to the base thereof. Circuit point 366 is coupled to ground through an inductor 374 and to the anode of a voltage controlled capacitor 376 having its cathode coupled both to ground through a capacitor 378 and to the tracking control line 130 through the resistor 380. The inductor 374, capacitor 378, and voltage controlled capacitor 376 form a tuned circuit resonant at approximately three times the frequency of the output of amplifier-tripler 50. The resonant frequency is altered by the application of a control voltage to the cathode of voltage controlled capacitor 376. The output of tripler 52 is taken from circuit point 366 and applied through a capacitor 382 to the base of transistor 166.

In order to operate the tracking circuitry, a second output from oscillator 19 is taken from the emitter of transistor 246 and is applied to an input of a high gain amplifier 384. That amplifier may comprise an integrated circuit RF-IF amplifier connected as a high gain amplifier. The emitter of transistor 246 is coupled to ground through a resistor 386 and to a first input of amplifier 384 through a capacitor 388. A second input of that amplifier is coupled to ground through a capacitor 390, to the positive voltage supply V through a resistor 392, and to the first input through a resistor 393. The amplifier 384 has a power terminal coupled to the positive voltage supply.

The output of amplifier 384 is coupled to a circuit point 394 in the frequency responsive circuit 56. That circuit includes two series coupled parallel resonant circuits. The circuit point 394 is coupled to a circuit point 396 through a first parallel resonant circuit including an inductor 398 and a capacitor 400. A second parallel resonant circuit including an inductor 402 and a capacitor 404 is coupled to circuit point 396. A tap on inductor 402 is coupled to the positive voltage supply V through a resistor 406, to ground through a capacitor 408, and to circuit point 396 through a resistor 410. Circuit point 394 is coupled through a capacitor 412 to the base of a PNP transistor 414.

The transistor 414 has its base additionally coupled to ground through the series combination of two resistors, 416 and 418. The junction of those two resistors is coupled to the cathode of a diode 420 having its anode coupled to the positive voltage supply. The emitter of that transistor is coupled to the positive voltage supply V through the resistor 422 and to ground through the series combination of a resistor 424 and a variable resistance 426 and the collector thereof is coupled both to ground through the parallel combination of a resistor 428 and a capacitor 430 and to the tracking control line 130 through a resistor 432. The tracking control line 130 is additionally coupled to ground through a capacitor 434.

To complete the circuit of FIG. 2, the emitter of transistor 314 in the U and T band switch circuit 76 is coupled to positive voltage supply V and to the base thereof through a resistor 436 while the collector is coupled to control line 104. The emitter of transistor 316 in the H band switch circuit is coupled to positive voltage supply V and to the base thereof through a resistor 438 while the collector is coupled to ground through a capacitor 440 and to control line 108. Control lines 104 and 108 are each coupled through resistors 442 and 444, respectively, to the base of an NPN transistor 446 included in tracking offset circuit 68. The emitter of that transistor is coupled to ground and the collector is coupled through the series combination of a variable resistor 448 and a resistor 450 to the base of a PNP transistor 452. The emitter of that transistor is coupled to the positive voltage supply V and to the anode of a diode 454 having its cathode coupled to the base thereof. The collector of transistor 452 is coupled to the tracking control line 130. The control line 104 is coupled to the anode of a diode 456 having its cathode connected to the base of a PNP transistor 458 which is, in turn, coupled to ground through a resistor 460. The emitter of that transistor is coupled to the positive voltage supply V and the collector is coupled to the control line 233. Transistor 458 performs the function of inverter 84. When a positive voltage is applied to its base, no positive voltage is applied to control line 233, but when no positive voltage is applied to its base, the emitter-base circuit thereof is forward biased through resistor 460 and a voltage approximately equal to that of the positive supply is applied to control line 233.

The operation of the tracking circuit will now be more fully explained. The frequency responsive circuit 56 includes two parallel resonant circuits effectively coupled between circuit point 394 and ground. The impedance of those circuits varies with the frequency of the applied signal so that the amplitude of the alternating frequency signal applied to the tracking amplifier varies in response to the frequency of operation of oscillator 19. The impedances of both the parallel resonant circuits may be altered by adjusting the inductances of inductors 396 and 398. Altering those inductances, of course, alters the relationship between the frequency of operation of oscillator 19 and the amplitude of the alternating signal applied to the tracking amplifier. The use of two parallel resonant circuits in frequency responsive circuit 56 permits the relationship between the frequency of oscillator 19 and the amplitude of the signal applied to the tracking amplifier to have a relatively steep slope, i.e., a relatively small change in the frequency of oscillator 19 results in a relatively large change in the amplitude of the signal applied to the tracking amplifier. Further, the use of two parallel resonant circuits permits the circuit designer relatively wide latitude in the selection of the shape of the relationship between oscillator frequency and the tracking amplifier input signal.

The output signal of frequency responsive circuit 56 is applied to the base of transistor 414. The network of resistors 416, 418, 424, and 426 and diode 420 normally supply a slight amount of forward bias to the emitter-base junction of transistor 414 but the level thereof is insufficient to cause the emitter-collector to be conductive. The bias level may be altered by adjustment of variable resistor 426. The negative going portions of the alternating current signal applied to the base of transistor 414 cause the emitter-collector of transistor 414 to become conductive so that the transistor acts as a rectifier circuit. Capacitors 430 and 434 act as filters and remove the alternating current component from the voltage applied to tracking control line 130 by transistor 414. The bias adjustment provided by variable resistor 426 permits alteration of the negative voltage which the signal at the base of transistor 414 must reach before the emitter-collector circuit thereof is rendered conductive and, thus, permits adjustment of the relationship between the amplitude of the alternating current signal present at the input to tracking amplifier 58 and the voltage on tracking control line 130.

The tracking offset circuit 60 provides apparatus for making relatively great variations in the voltage present on tracking control line 130 and, thus, in the operating frequencies of the various circuits controlled thereby. In the circuit of FIG. 2, when the receiver is tuned to a channel in either the H, U, or T bands, a positive control voltage is applied from either of control lines 104 or 108 to the base of transistor 446 causing the emitter-collector circuit thereof to become conductive and permitting a current to flow from the positive voltage supply V through the emitter-base circuit of transistor 452 and resistor 450 and variable resistor 448 to ground. The magnitude of that current may be altered by adjustment of variable resistor 448. The emitter-base current in transistor 452 causes a corresponding current to flow in the emitter-collector circuit thereof and resistors 432 and 448 so that a positive increment of voltage appears on tracking control line 130. When the receiver is tuned to a channel in the L band, the emitter-collector circuits of neither of transistors 442 or 452 is conductive so that no positive increment of voltage is applied by tracking offset circuit 60 to tracking control line 130.

The tracking offset permits the use of a single tracking signal to control the response of the operating frequencies of the various circuits controlled thereby over a plurality of bands. Thus, in the receiver of FIG. 2, a single limiter 54, frequency responsive circuit 56, and tracking amplifier 58 are used to develop the tracking signal used in all four L, H, U, and T bands. The tracking offset also permits the detuning of a circuit in the receiver so it may be made inoperative during reception on certain bands. As partially explained above, during reception of a signal on the U, T, or H bands, a positive increment of voltage appears on tracking control line 130 which is applied to the voltage controlled capacitor 350 included in the amplifier-tripler circuit 50. That increment of voltage is required to tune the tuned circuit including inductor 334, capacitor 342, and voltage controlled capacitor 352 to the third harmonic of the frequency of oscillator 19. In the absence of that voltage increment during reception on the L band, the tuned circuit is sufficiently detuned that it presents a very low impedance to signals at the frequency of oscillator 19 or any integral multiple thereof relative to the impedance of resistor 336. The amplifier-tripler circuit 50 thus produces a signal at the frequency of oscillator 19.

In one receiver 10 of this invention, the components shown in FIG. 2 were more fully identified as follows:

| | |
|---|---|
| 102, 106, 208, 232, 352, 354, 442, 444 | 10 Kohms |
| 128, 160, 198, 238, 250, 348, 380 | 33 Kohms |
| 140, 386 | 330 Ohms |
| 142, 174 | 2.2 Kohms |
| 146, 428, 432 | 6.8 Kohms |
| 170 | 3.3 Kohms |
| 172, 206, 243, 252, 392, 418 | 22 Kohms |
| 216 | 56 Kohms |
| 220 | 27 Kohms |
| 221 | 10 Ohms |
| 244, 424 | 4.7 Kohms |
| 245 | 68 Kohms |
| 318, 324, 328 | 470 Ohms |
| 320, 326 | 5.6 Kohms |
| 336, 406 | 100 Ohms |
| 370, 436, 438 | 47 Kohms |
| 368 | 1 Kohm |
| 410 | 82 Ohms |
| 416 | 1.8 Kohms |
| 422 | 270 Ohms |
| 426, 448 | 10 Kohms |
| 450 | 8.2 Kohms |
| 110 | A-219-1 |
| 114 | A-218-1 |
| 124, 154, 374 | A-508-1 |
| 134, 164 | A-508-2 |
| 148 | A-218-4 |
| 180–182 | B-217-2 |
| 188 | A-509 |
| 194, 224 | B-501-2 |
| 200, 226 | B-511 |
| 254 | A-218-3 |
| 334 | B-501-1 |
| 398–400 | B-502-2 |
| 402–404 | B-502-1 |
| 120, 176, 358, 388, 390, 408, 412, 430 | 0.001 Mfd. |
| 122 | 2.2 Pfd. |
| 136 | 33 Pfd. |
| 144, 218 | 27 Pfd. |
| 150, 162 | 15 Pfd. |
| 152, 186 | 3.3 Pfd. |
| 168, 240, 330 | 68 Pfd. |
| 178, 342, 364 | 10 Pfd. |
| 190, 256 | 6.8 Pfd. |
| 204, 434 | 100 Pfd. |
| 210, 234, 338, 346, 440 | 470 Pfd. |
| 228 | 0.01 Mfd. |
| 248 | 82 Pfd. |
| 255 | 0.02 Mfd. |
| 378 | 22 Pfd. |
| 382 | 1 Pfd. |
| 100, 202, 230, 356 | MPN-3401 |
| 116, 118, 420, 454 | 1N914 |
| 126, 156, 376 | BB-105A |
| 138, 166, 362 | 2N5179 |
| 212, 236, 350 | BB-209 |
| 214, 242 | 3N201 |
| 246, 322 | 2N3563 |
| 314, 316, 452 | 2N4126 |
| 384 | LM-703LN |
| 414 | MPS-3640 |
| 446 | MPS-3393 |

In the above list, those components identified by a designation including the single letter "A" or "B" are available from Electra Company, Cumberland, Ind.

It will thus be seen that a signal-seeking, scanning radio receiver has been provided which is operable on all four bands including the designated public safety radio service frequencies. That receiver includes a minimum number of component parts, provides tracking on all four bands, and fulfills each of the above-mentioned objects. It will be obvious that many modifications of the specific embodiment shown may be made without departing from the spirit and scope of this invention. As an example of the wide scope of modification to which this invention is susceptible, the same basic configuration of the receiver might be used but with an oscillator circuit operative to generate signals at frequencies directly usable by the U and T band mixer. That oscillator signal could then be divided by a factor of three for use in the H band and by a further factor of three for use in the L band. In view of this possible modification, the term "multiple" as used in the claims should be taken as including the possibility of submultiples.

It is contemplated, therefore, by the appended claims, to cover any such modifications as fall within the true spirit and scope of this invention.

I claim:

1. A radio receiver capable of sequentially tuning to a plurality of different frequencies located in three different frequency bands and including superheterodyne tuning means for tuning signals at said frequencies located in said three frequency bands and local oscillator means for generating local oscillator signals used by said superheterodyne tuning means, said local oscillator means comprising:

oscillator means for producing an oscillator signal at a plurality of different frequencies;

first circuit means coupled to said oscillator for producing at an output a signal at selectively the frequency of the signal applied thereto or a third multiple of the frequency of the signal applied thereto;

coupling means for coupling said first circuit means output to said superheterodyne tuning means;

second circuit means coupled to said first circuit means for producing at an output a signal at the frequency of a third multiple of the frequency of the signal applied thereto; and coupling means for coupling said second circuit means output to said superheterodyne tuning means.

2. A radio receiver capable of sequentially tuning to a plurality of different frequencies located in a plurality of different frequency bands and including first superheterodyne tuning means for tuning signals at said frequencies located in first and second ones of said bands, second superheterodyne tuning means for tuning signals at said frequencies located in a third one of said bands, and local oscillator means for generating local oscillator signals used by said first and second superheterodyne means, said local oscillator means comprising:

oscillator means for producing an oscillator signal at a plurality of different frequencies;

first circuit means coupled to said oscillator for producing at an output a signal at selectively the frequency of the signal applied thereto or a third multiple of the frequency of the signal applied thereto;

second circuit means coupled to said first circuit means for producing at an output a signal at a third multiple of the frequency of the signal applied thereto; and coupling means coupled to said first circuit means output and said second circuit means output for coupling said first and second circuit means outputs to said first and second superheterodyne tuning means.

3. A radio receiver capable of sequentially tuning to a plurality of different frequencies located in a plurality of different frequency bands and including first radio frequency tuning means for tuning signals at said frequencies located in first and second ones of said bands, second radio frequency tuning means for tuning signals at said frequencies located in a third one of said bands, local oscillator means for generating local oscillator signals used by said first and second radio frequency tuning means, and intermediate frequency circuit means coupled to said first and second radio frequency tuning means, said local oscillator means comprising:
 oscillator means for producing an oscillator signal at a plurality of different frequencies;
 first circuit means coupled to said oscillator and having an output coupled to said first radio frequency tuning means and having a first operative state wherein a signal at the frequency of operation of said oscillator is produced at said output and a second operative state wherein a signal at three times the frequency of operation of said oscillator is produced at said output;
 second circuit means coupled to said first circuit means and said second radio frequency tuning means for applying a signal at nine times the frequency of said oscillator signal to said second radio frequency tuning means when said first circuit means is in said second operative state; and
 control circuit means coupled to said radio frequency tuning means and said first circuit means for enabling the application of an output signal from said first radio frequency tuning means to said intermediate frequency means and disabling the application of an output signal from said second radio frequency tuning means to said intermediate frequency circuit means when said receiver is tuned to one of said frequencies in said first and second bands, for disabling the application of an output signal from said first radio frequency tuning means to said intermediate frequency circuit means and enabling the application of an output signal from said second radio frequency tuning means to said intermediate frequency circuit means when said receiver is tuned to one of said frequencies in said third band, and for placing said first circuit means in said first operative state when said receiver is tuned to one of said frequencies in said second and third frequency bands.

4. The radio receiver of claim 3 wherein said first radio frequency tuning means further comprises electrical signal filter means having a first operative state for passing signals at frequencies in said first frequency band and a second operative state for passing signals at frequencies in said second frequency band and said control means is further coupled to said electrical signal filter means and places said electrical signal filter means in said first state when said receiver is tuned to one of said frequencies in said first band and in said second state when said receiver is tuned to one of said frequencies in said second band.

5. The radio receiver of claim 3 wherein when said receiver is tuned to one of said frequencies in said first band, the frequency of said oscillator signal is greater than the frequency of the tuned signal, when said receiver is tuned to one of said frequencies in said second band, the frequency of said oscillator signal is less than one-third the frequency of the tuned signal, and when said receiver is tuned to one of said frequencies in said third band, the frequency of said oscillator signal is less than one-ninth of the frequency of said tuned signal.

6. A radio receiver capable of sequentially tuning to a plurality of different frequencies located in first and second different and spaced apart frequency bands and comprising:
 input means for receiving input signals at said frequencies;
 electrical signal filter means having a first operative state for passing signals at frequencies in said first frequency band and a second operative state for passing signals at frequencies in said second frequency band;
 oscillator circuit means for producing signals at a plurality of different frequencies;
 first circuit means coupled to said oscillator and having a first operative state wherein a signal at the frequency of operation of said oscillator is produced at an output and a second operative state wherein a signal at three times the frequency of operation of said oscillator is produced at said output;
 signal mixing circuit means coupled to said electrical signal filter means and said first circuit means for mixing the signals applied thereto;
 intermediate frequency circuit means coupled to an output of said signal mixing circuit means;
 control means coupled to said electrical signal filter means and said first circuit means for placing said electrical signal filter means in its said first operative state and said first circuit means in its said first operative state when said radio receiver is tuned to one of said frequencies in said first frequency band and placing said electrical signal filter means in its said second operative state and said first circuit means in its said second operative state when said radio receiver is tuned to one of said frequencies in said second frequency band.

7. A radio receiver capable of sequentially tuning to a plurality of different frequencies and including radio frequency tuning means for tuning signals at said frequencies and local oscillator means for generating local oscillator signals used by said radio frequency tuning means, said radio frequency tuning means including filter circuit means having frequency response characteristics alterable in accordance with an electrical signal applied thereto and said local oscillator means comprising oscillator means for producing an oscillator signal at a plurality of different frequencies, and tracking circuit means coupled to said oscillator means and said filter circuit for altering the frequency response characteristics of said filter circuit means in response to changes in the frequency to which said radio frequency tuning means is tuned, said tracking circuit means comprising:
 first and second resonant circuits coupled to an output of said oscillator means and producing an alternating signal which varies in amplitude in response to the frequency of operation of said oscillator means; and
 circuit means coupled to said first and second resonant circuits and said filter circuit means for controlling the frequency response of said filter circuit means in response to the amplitude of said alternating signal.

8. The radio receiver of claim 7 wherein said first and second resonant circuits are both parallel resonant circuits.

9. The radio receiver of claim 8 wherein said first and second resonant circuits are coupled in series.

10. A radio receiver capable of sequentially tuning to a plurality of different frequencies located in first, second, and third different and spaced apart frequency bands and comprising:
  first radio frequency tuning means for tuning signals in said first and second frequency bands and comprising first electrical signal filter means having a first operative state for passing signals at frequencies in said first frequency band and a second operative state for passing signals at frequencies in said second frequency band and a first signal mixing circuit coupled to said first electrical signal filter means;
  second radio frequency tuning means for tuning signals in said third frequency band and comprising second electrical signal filter means for passing signals at frequencies in said third frequency band and a second signal mixing circuit coupled to said second electrical signal filter means;
  oscillator circuit means for producing oscillator signals at a plurality of different frequencies;
  first circuit means coupled to said oscillator circuit means and said first signal mixing circuit and having a first operative state wherein a signal at the frequency of said oscillator signal is applied to said first signal mixing means and a second operative state wherein a signal at three times the frequency of said oscillator signal is applied to said first signal mixing means;
  second circuit means coupled to said first circuit means and said second signal mixing circuit for applying a signal at nine times the frequency of said oscillator signal to said second signal mixing circuit when said first circuit means is in said second operative state;
  intermediate frequency circuit means coupled to said first and second signal mixing circuits; and
  control circuit means for placing said first electrical signal filter means in said first state, said first circuit means in said first state, and enabling the application of a signal from said first signal mixing circuit to said intermediate frequency circuit means and disabling the application of a signal from said second signal mixing circuit to said intermediate frequency circuit means when said receiver is tuned to one of said frequencies in said first band, for placing said first electrical signal filter means in said first state, said first circuit means in said second state, and enabling the application of a signal from said first signal mixing circuit to said intermediate frequency circuit means and disabling the application of a signal from said second signal mixing circuit to said intermediate frequency circuit means when said receiver is tuned to one of said frequencies in said second band, and for placing said first circuit means in said second state and disabling the application of a signal from said first signal mixing circuit to said intermediate frequency circuit means and enabling the application of a signal from said second signal mixing circuit to said intermediate frequency circuit means when said receiver is tuned to one of said frequencies in said third band.

11. The radio receiver of claim 10 wherein the frequency response characteristics of said first electrical signal filter means are variable in response to the magnitude of a tracking signal applied thereto and said receiver further comprises a tracking circuit comprising:
  first tracking circuit means coupled to said oscillator and producing a first signal having a parameter which varies in response to the frequency of operation of said oscillator means;
  second tracking circuit means coupled to said first tracking circuit means and said first electrical signal filter means and producing a tracking signal for controlling the frequency response of the first electrical signal filter means; and
  third tracking circuit means coupled to said second tracking circuit means for altering the magnitude of said second signal in response to changes in the frequency band to which said radio receiver is tuned.

12. The radio receiver of claim 11 wherein the frequency response characteristics of said second electrical signal filter means are variable in response to a tracking signal applied thereto and said second tracking circuit means is further coupled to said second electrical signal filter means for controlling the frequency response characteristics of said second electrical signal filter means.

13. The radio receiver of claim 11 wherein said first tracking circuit means comprises first and second resonant circuits in combination.

14. A radio receiver capable of sequentially tuning to a plurality of different frequencies located in a plurality of different frequency bands and including radio frequency tuning means for tuning signals at said frequencies and local oscillator means for generating local oscillator signals used by said radio frequency tuning means, said radio frequency tuning means including filter circuit means having frequency response characteristics alterable in accordance with an electrical signal applied thereto and said local oscillator means including oscillator means for producing at an output an oscillator signal at a plurality of different frequencies and frequency multiplier means having frequency response characteristics alterable in accordance with an electrical signal applied thereto, and tracking circuit means coupled to said oscillator means and said filter circuit means for altering the frequency response characteristics of said filter circuit means in response to changes in the frequency to which said radio receiver is tuned, said tracking circuit means comprising:
  first circuit means coupled to said oscillator means output and producing a first signal having a parameter which varies in response to the frequency of operation of said oscillator means;
  second circuit means coupled to said first circuit means and said filter circuit means and producing a second signal for controlling the frequency response of said filter circuit means;
  third circuit means coupled to said second circuit means for altering the magnitude of said second signal in response to changes in the frequency band to which said radio receiver is tuned; and
  fourth circuit means coupled between said second circuit means and said frequency multiplier means for altering the frequency response characteristics of said frequency multiplier means in response to said second signal.

* * * * *